US009013830B2

(12) United States Patent
Guan (10) Patent No.: US 9,013,830 B2
(45) Date of Patent: Apr. 21, 2015

(54) NON-UNIFORM WRITE GAP PERPENDICULAR WRITER FOR SHINGLE WRITING

(71) Applicant: Headway Technologies, Inc., Milpitas, CA (US)

(72) Inventor: Lijie Guan, Milpitas, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 14/533,724

(22) Filed: Nov. 5, 2014

(65) Prior Publication Data

US 2015/0055252 A1  Feb. 26, 2015

Related U.S. Application Data (62) Division of application No. 14/033,736, filed on Sep. 23, 2013, now Pat. No. 8,896,965, and a division of application No. 13/134,600, filed on Jun. 10, 2011, now Pat. No. 8,542,463.

(51) Int. Cl.
*G11B 5/23* (2006.01)
*G11B 5/31* (2006.01)
*G11B 5/10* (2006.01)
*G11B 5/127* (2006.01)
*G11B 5/60* (2006.01)

(52) U.S. Cl.
CPC ............... *G11B 5/23* (2013.01); *G11B 5/6082* (2013.01)

(58) Field of Classification Search
CPC ................................. G11B 5/1278; G11B 5/23
USPC ............ 360/119.02, 119.03, 119.04, 125.03, 360/125.13, 125.3
See application file for complete search history.

(56) References Cited

U.S. PATENT DOCUMENTS

| 7,102,854 B2 | 9/2006 | Wang et al. |
| 7,475,470 B2 | 1/2009 | Mochizuki et al. |
| 7,477,481 B2 | 1/2009 | Guthrie et al. |
| 8,134,802 B2 | 3/2012 | Bai et al. |

OTHER PUBLICATIONS

"The Feasibility of Magnetic Recording at 10 Terabits Per Square Inch on Conventional Media," Roger Wood, et al., IEEE Transactions on Magnetics, vol. 45, No. 2, Feb. 2009, pp. 917-923.

*Primary Examiner* — Craig A. Renner
(74) *Attorney, Agent, or Firm* — Saile Ackerman LLC; Stephen B. Ackerman (57) ABSTRACT

A PMR writer is disclosed that includes a recessed center section in the write pole trailing edge and a center recessed trailing shield to improve the field gradient at track edge. In all embodiments, there is a non-uniform write gap between the trailing edge and the trailing shield. The recessed portion of the write pole trailing edge and/or center recess of the trailing shield has a thickness from 10 to 40 nm in a down-track direction and a width in a cross-track direction of 20 to 200 nm. The distance between the center recess and a corner of the trailing edge is from 20 to 80 nm. A sequence of steps is provided to fabricate the two embodiments of the present invention.

6 Claims, 6 Drawing Sheets

NON-UNIFORM WRITE GAP PERPENDICULAR WRITER FOR SHINGLE WRITING

This is a Divisional application of U.S. patent application Ser. No. 14/033,736 filed on Sep. 23, 2013, which is a divisional application of U.S. Ser. No. 13/134,600, filed on Jun. 10, 2011, now issued as U.S. Pat. No. 8,542,463, which are herein incorporated by reference in their entirety, and assigned to a common assignee.

RELATED PATENT APPLICATION

This application is related to U.S. Pat. No. 8,134,802; assigned to the same assignee as the current invention and which is herein incorporated by reference in its entirety.

FIELD OF THE INVENTION

The invention relates to an improved write pole and write gap design that enables a higher field gradient at track edge and thereby enhances the performance of shingle writing for high density product applications.

BACKGROUND OF THE INVENTION

Shingled writing is a form of PMR (perpendicular magnetic recording) that is believed to be capable of extending PMR beyond 1 Tb/in$^2$, and has been proposed for future high density magnetic recording by R. Wood et al. in "The Feasibility of Magnetic Recording at 10 Terabits Per Square Inch on Conventional Media", IEEE Trans. Magn., Vol. 45, pp. 917-923 (2009). In this scheme, tracks are written in a sequential manner from an inner diameter (ID) to an outer diameter (OD), from OD to ID, or from OD and ID towards a middle diameter (MD) in a radial region of a disk in a hard disk drive (HDD). A first track is partially overwritten on one side when a second track adjacent to the first track is written, and subsequently a third track is written that partially overwrites the second track, and so forth. Each track only experiences a one time squeeze from the next track. In shingle writing, each track is only subjected to one neighboring track encroachment while in conventional PMR each track must sustain multiple adjacent track erasures (ATE) from neighboring track writing. Track widths in shingle writing are defined by the squeeze position or amount of overwrite on the next track rather than by the write pole width as is the case in today's hard drives. As a result, write pole width no longer needs to scale with the written track width, and narrow track widths of 60 nm or below can be achieved with a much wider write pole width which is a condition that leads to good writability. In other words, the opportunity for improved writability and higher device yield is not restricted by using pole width as a critical dimension to be tightly controlled.

Figure 1:
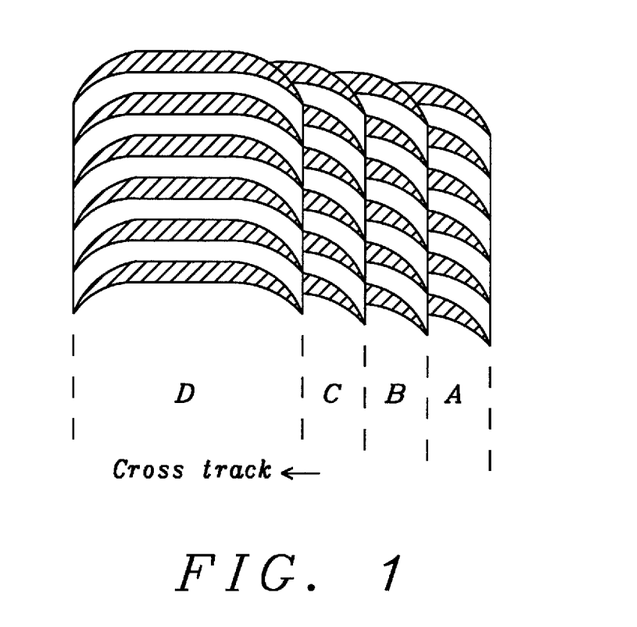
FIG. 1 is an illustration of shingled writing in a cross track direction from right to left.

Referring to FIG. 1, one issue associated with shingled writing is that track edge writing and transition curvature have larger impacts on written tracks compared with conventional writing because of writing from only one corner of the write pole and the one side squeeze associated with each track. This effect is depicted in FIG. 1 where four tracks A-D are sequentially overlaid on one another such that track B partially overwrites track A, track C partially overwrites track B, and track D overwrites a side of track C. Due to the one-side squeeze and the shape of the field contour at one side of the write pole, written transitions will be skewed even when the writer and reader are at zero skew. Note that the transitions shown as alternating light and dark colored bands are all sloped (skewed) with respect to the cross-track direction for tracks A-C that have a one side squeeze.

Secondly, the field gradient at track edge is much lower than at track center. To take advantage of shingle writing, the field gradient at track edge needs to be improved so that write performance is enhanced.

A search of the prior art revealed the following references. In U.S. Pat. No. 7,475,470, a write pole is described with a recessed trailing edge having a curved, triangular, or trapezoidal shape but there is no portion of the trailing edge that is parallel to a leading edge. Therefore, track width is limited to be equal to write pole width.

U.S. Pat. No. 7,477,481 teaches that a write gap thickness is critical but does not mention a recess in a write pole or in a trailing shield. U.S. Patent Application 2005/0073774 discloses a method of reduced side writing.

SUMMARY OF THE INVENTION

One objective of the present invention is to enhance the field gradient at track edge in a shingle writer so that write performance is improved.

Another objective of the present invention is to provide a method of forming a PMR writer that enables an enhanced field at track edge according to the first objective.

According to a first embodiment of the present invention, the first objective is achieved with a write pole that is symmetrical with respect to a center plane formed perpendicular to a leading edge, and separated from a trailing shield by a write gap and from a side shield by a side gap. The write gap has a planar top surface that adjoins the trailing shield. The leading write pole edge has a smaller width in a cross track direction than the trailing edge and is a straight edge that may be coplanar with a bottom surface of a full side shield. Leading and trailing edges are connected by two sides wherein a first side intersects one end of the trailing edge at a first corner and the second side intersects the opposite end of the trailing edge at a second corner. The trailing edge of the write pole at the ABS is non-planar and is comprised of three sections. Two end sections terminating at the two corners are formed parallel to the substrate and a middle section preferably has a concave curvature whereby a center point formed along the center plane that bisects the write pole is a lesser distance from the leading edge than the two end sections. In one aspect, the middle section is bowed toward the substrate in a substantially semi-circular shape such that the center of the curved arc has the lowest pole height (largest recess) on the trailing edge. Alternatively, the concave middle section may have a trapezoidal or rectangular shape. The depth and width of the recessed middle section have the largest effect on enhancing the field gradient (Oe/nm) at track edge during a write process. In the exemplary embodiment, a top surface of each side shield interfaces with the bottom of the trailing shield to form a wrap around design.

In a second embodiment, the write pole is symmetrical with respect to a center plane formed perpendicular to the leading edge and has the same sides and leading edge as in the first embodiment. However, the trailing edge is modified to a straight line and the top surface of the write pole at the ABS is formed parallel to the substrate. An important feature is that the top surface of the write gap is no longer uniform but is comprised of three sections. Two end sections are formed parallel to the trailing edge of the write pole, and a middle section preferably has a convex curvature whereby a center point formed along the center plane that bisects the write pole is a greater distance from the trailing edge than the two end sections. In one aspect, the middle section is bowed away from the substrate in a substantially semi-circular shape such that the center of the curved arc is a greater distance from the trailing edge than any other point on the top surface of the write gap. Alternatively, the convex middle section may have a trapezoidal or rectangular shape that protrudes above the otherwise essentially planar write gap top surface. The features of the side shields and trailing shield may be retained from the previous embodiment.

According to a third embodiment, the features of the first and second embodiments are combined in a single structure comprised of a write pole having a recessed middle section of a trailing edge, and a recessed middle section of a trailing shield. Preferably, the recessed section of the trailing edge is aligned below the recessed section of the trailing shield in a down-track direction and the width of each recessed section is substantially the same in a cross-track direction.

A method is provided for forming a symmetrical write pole with a recessed trailing edge that includes plating and planarization of a write pole within a dielectric layer. The dielectric layer and side sections of the write pole surface are protected while a slanted angle IBE process selectively removes a middle portion of the trailing side of the write pole to form a symmetrical and recessed opening having a curved, rectangular, or trapezoidal shape. Thereafter, a write gap layer is deposited on the write pole followed by a planarization step to give a write gap with a substantially planar top surface that is formed parallel to the substrate.

A method involving a sequence of steps is also provided for forming a recessed middle section of a write shield. A write pole with a planar top surface is formed within a dielectric layer as in the previous embodiment. Then a write gap layer with a planar top surface is laid down on the write pole and dielectric layer. A photoresist mask layer is formed with an opening at the ABS and above the recessed section of the trailing edge. Then a dielectric layer that may be comprised of the same material as in the write gap layer is deposited in the opening to form a protrusion above an otherwise substantially planar top surface of the write gap. Thereafter, the photoresist layer is selectively removed and a magnetic layer is deposited that forms the side shields and trailing shield.

DETAILED DESCRIPTION OF THE INVENTION

The present invention is a PMR writer for shingled writing wherein the write gap is non-uniform to provide an enhanced field gradient at the track edge. Although the exemplary embodiment depicts a trapezoidal shaped write pole, the present invention also encompasses other write pole shapes with a trailing edge having a substantial portion thereof formed parallel to a substrate. In general, the bottom surface of a layer is defined as a side facing the substrate and top surface is a side facing away from the plane of the substrate. Width refers to a distance in a cross-track direction and thickness or depth relates to a distance in a down-track direction. The present invention anticipates that the write head may have one or both of a center recessed trailing edge for the write pole and a center recessed trailing shield. The PMR writer as described herein may also include a leading shield without diminishing any advantages provided by the non-uniform write gap layer.

Figure 2:
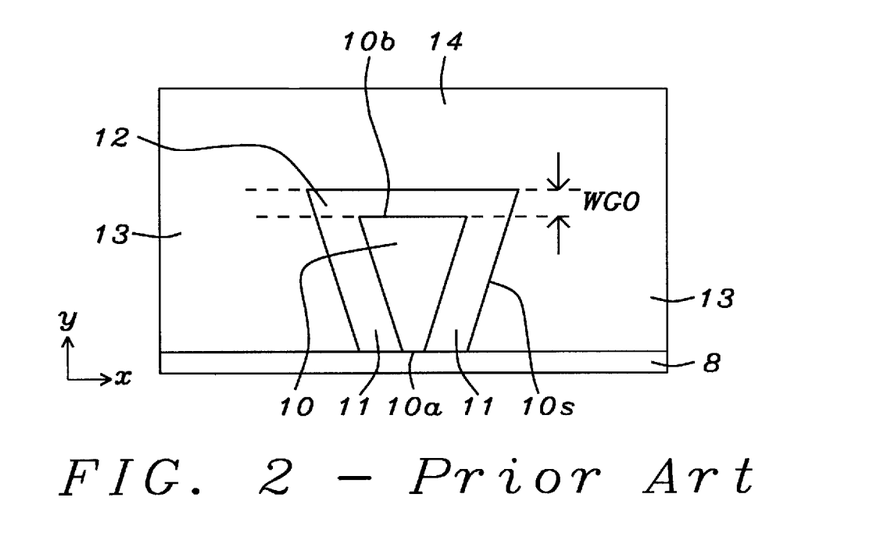
FIG. 2 is a cross-sectional view from an ABS plane that shows a prior art PMR write pole with trapezoid shape, a flat trailing edge parallel to a substrate, and a planar top surface of a write gap that interfaces with a trailing shield.

Referring to FIG. 2, a conventional PMR writer including a write pole 10 having a trapezoidal shape and with a leading edge 10a, sides 10s, and a trailing edge 10b is depicted. The sides 10s are beveled such that the leading edge has a lesser width in the cross-track (x-axis) direction than the trailing edge. There is a write gap layer 12 with a uniform thickness WGO formed between the trailing edge 10b and the trailing shield 14. A side shield 13 adjoins each side gap 11.

We have previously described in related patent application Ser. No. 12/589,829 how a conventional PMR writer generates transitions with curvature (skew) during shingle writing. A non-planar write pole with a "V" shaped trailing edge was disclosed to remedy this problem. Now we have discovered that further modification of the trailing edge of a write pole or modification of the write gap adjoining the write pole trailing edge leads to additional improvement in terms of higher field gradient at track edge.

Figure 3:
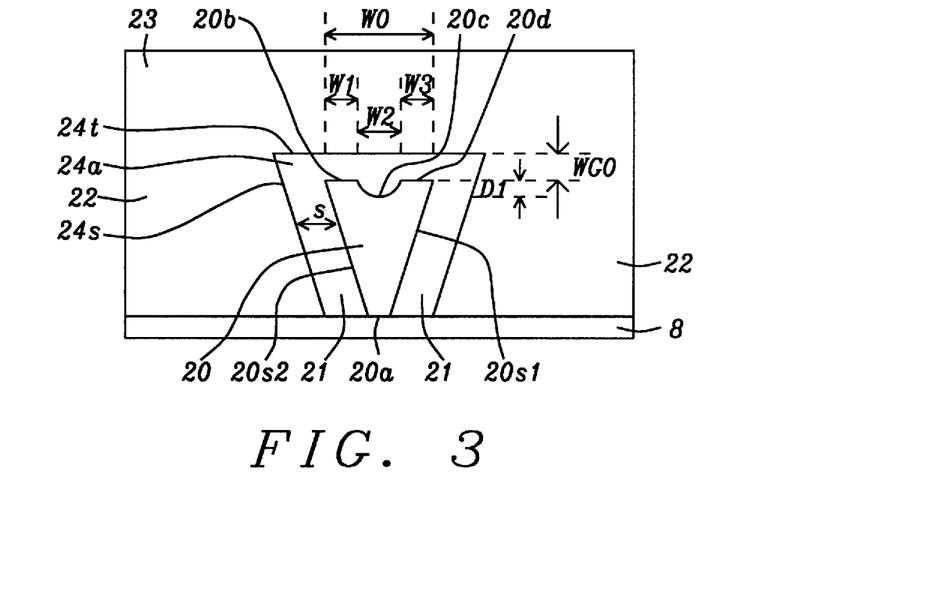
FIG. 3 is a cross-sectional view of a center recessed write pole and an overlying write gap having a planar top surface formed according to a first embodiment of the present invention.

Referring to FIG. 3, a first embodiment of the present invention is depicted and includes a write pole 20 having a substantially trapezoidal shape with a leading edge 20a that has a smaller width in a cross-track direction than the width W0 of the trailing edge comprised of sections 20b-20d. Sloped sides 20s1, 20s2 of the write pole connect the leading edge to the trailing edge and are adjoined by a side gap 21 made of a dielectric material that has a width s in a cross-track direction. According to one embodiment, side 20s1 adjoins section 20d at a right corner of the write pole and side 20s2 adjoins section 20b at a left corner of the write pole. There is also a write gap 24a that adjoins each side gap 21 and interfaces with the trailing edge 20b-20d of the write pole. An important feature is the non-uniform thickness of the write gap. In particular, the write gap has a thickness WGO from 15 to 30 nm over end sections 20b, 20d and above side gap 21 but a thickness >WGO over a recessed center section 20c of the trailing edge. Note that the write gap 24a has a planar top surface 24t which interfaces with trailing shield 23 but the bottom surface that interfaces with write pole 20 is non-planar.

In the exemplary embodiment, the end sections 20b, 20d connect a side 20s2, 20s1, respectively, to the center section 20c that has a concave curvature wherein any point on the recessed center section is a lesser distance from the leading edge than the end sections. In the recessed center section 20c, the width W2 which is from 20 to 200 nm in a cross-track direction and depth D1 of 10 to 40 nm in a down-track direction may be adjusted to optimize the field gradient at track edge during a write process. Preferably, the width W1 of end section 20b is equal to width W3 of end section 20d and each are from 20 to 80 nm depending on the desired track width. W1 is preferably equal to W3 since the writer may be used for both right corner and left corner writing and the track width should be equal in both cases. Unlike the prior art, W1 and W3 are >0 nm to enable flexibility in adjusting the track width to meet device specifications without changing the width W0 of the write pole. Thus, W1 and W3 scale with track width, and as W1 and W3 increase in size, track width decreases. Note that W1, W2, and W3 are limited to a minimum size of about 20 nm because of process limitations in forming a critical dimension smaller than that magnitude. It should be understood that the recessed center section does not need to extend more than about a neck height distance from the ABS toward the back end of the slider to provide the desired field gradient improvement.

According to one embodiment, there is a side shield 22 adjoining each side gap 21 along a side formed parallel to a write pole side 20s, and having a bottom surface that is formed coplanar with a bottom surface of side gap 21 and leading edge 20a. Furthermore, each side shield 22 may interface with a bottom surface of top shield 23 to form a wrap around shield design.

Figure 4:
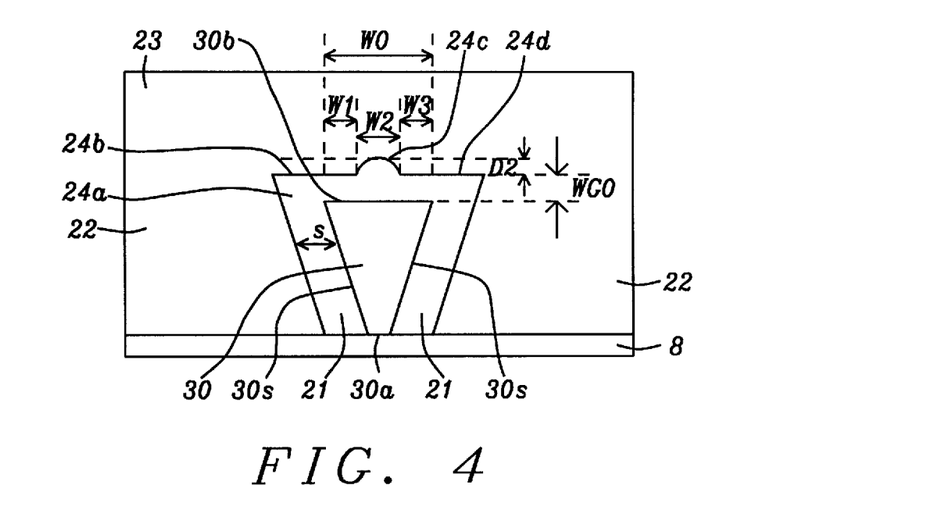
FIG. 4 is a cross-sectional view of a center recessed trailing shield formed over a trapezoidal shaped write pole having a flat trailing edge according to a second embodiment of the present invention.

Referring to FIG. 4, a second embodiment of the present invention is shown and includes a write pole 30 having a trapezoidal shape with a leading edge 30a that has a smaller width in a cross-track direction than the width W0 of the trailing edge 30b. Sloped sides 30s of the write pole are adjoined by a side gap 21 made of a dielectric material that has a width s in a cross-track direction. There is also a write gap 24a that adjoins each side gap 21 and interfaces with the trailing edge 30b of the write pole. The write gap has a non-uniform thickness as in the first embodiment and is comprised of a dielectric material. However, a top surface of the write gap 24a that interfaces with the trailing shield 23 is non-uniform, and has a center section 24c with a convex curvature and end sections 24b, 24d. As a result, the write gap thickness WG0 above side gap 21, and between trailing edge 30b and end sections 24b, 24d is less than the thickness between center section 24c and the trailing edge. In the exemplary embodiment, the end sections 24b, 24d are formed parallel to substrate 8. Middle section has a width W2 from 20 to 200 nm and a maximum thickness of WG0+D2 where D2 is 10 to 40 nm. Any point along curved center section 24c is formed a greater distance from substrate 8 than end sections 24b, 24d. In general, the field gradient at the track edge is increased by increasing one or both of W2 and D2. Preferably, the width W1 of a portion of end section 24b formed above trailing edge 30b is equal to the width W3 of a portion of end section 24d formed above the trailing edge and each are from 20 to 80 nm. As in the first embodiment, track width is determined by W1 and W3 and may be modified according to design requirements.

There is a side shield 22 adjoining each side gap 21 along a side formed parallel to a write pole side 30s, and having a bottom surface that is formed coplanar with a bottom surface of side gap 21 and leading edge 30a. Furthermore, each side shield 22 may interface with a bottom surface of top shield 23 to form a wrap around shield design. The configuration pictured in FIG. 4 is considered to be a center recessed trailing shield design because the middle section 24c of the write gap protrudes into the trailing shield such that there is a non-planar bottom surface of the trailing shield 23 which interfaces with the write gap 24a.

Figure 5:
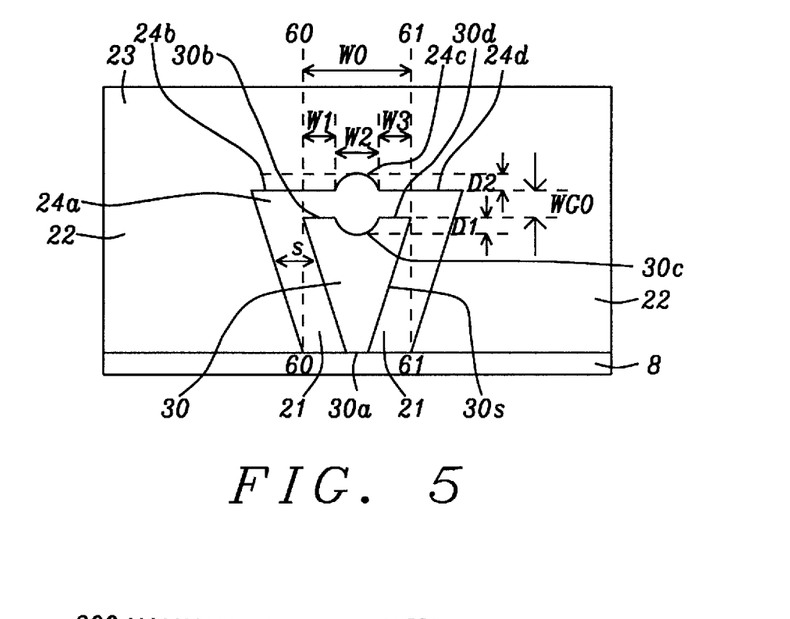
FIG. 5 is a cross-sectional view of a center recessed trailing shield formed over a center recessed write pole according to a third embodiment of the present invention.

Referring to FIG. 5, a third embodiment of the present invention is depicted that represents a modification of the second embodiment. In particular, all of the features of the second embodiment are retained except a planar trailing edge on the write pole 30 is replaced with a non-planar trailing edge comprised of end sections 30b, 30d and a center recessed section 30c. In the exemplary embodiment, center recessed section 30c in the write pole trailing edge is aligned below curved middle section 24c of the write gap and each of the sections 24c, 30c has a width W2 in a cross-track direction. However, the present invention also anticipates that the sections 24c, 30c may have different widths in a cross-track direction. Furthermore, the distance (depth) D2 of middle section 24c may be unequal to depth D1 of recessed section 30c. As a result, the maximum thickness of the non-uniform write gap 24a is WGO+D1+D2 along a plane (not shown) that bisects write pole 30 and is formed perpendicular to substrate 8. Therefore, if D1 and D2 are each from 10 to 40 nm as in previous embodiments, the variable thickness (WGO+D1+D2) is greater than the fixed thickness WGO by a maximum value of 20 to 80 nm. One or all of parameters W2, D1, and D2 may be adjusted to optimize the field gradient at the track edge which is either along plane 60-60 or 61-61 depending on whether the write pole is a right corner writer or left corner writer. Right corner is the point where plane 61-61 intersects with end section 30d and left corner is the point where plane 60-60 intersects with end section 30b. In yet another embodiment, center recessed section 30c may have a first shape that is a semi-circle, trapezoid, or rectangle while curved middle section 24c may have a second shape that is one of the aforementioned shapes but is different than the first shape. As in the first two embodiments, W1 preferably equals W3 so that when shingle writing occurs at either the right corner or left corner, the track width will be essentially constant.

Figure 6:
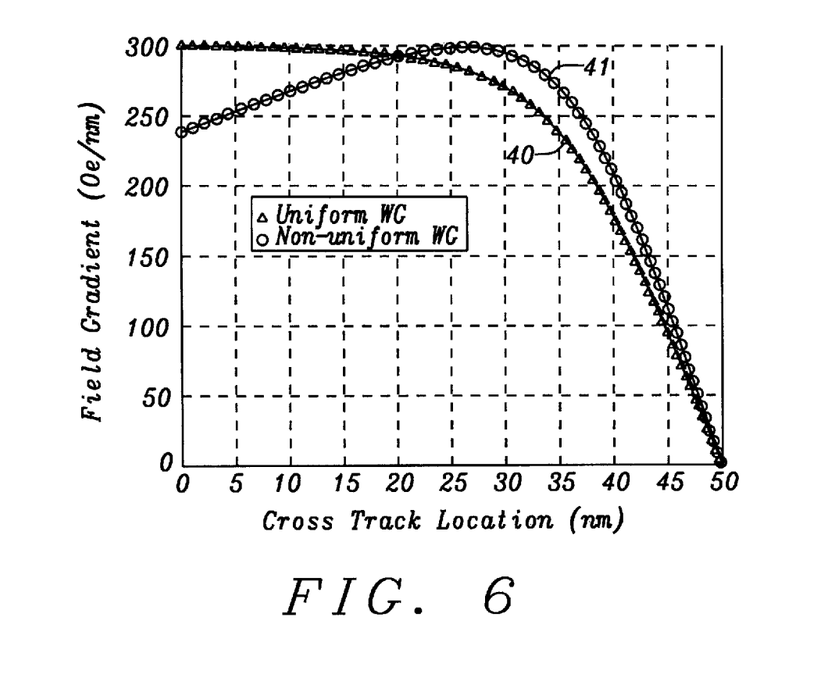
FIG. 6 is a plot showing field gradient vs. cross-track location for a trapezoidal write pole having a uniform write gap and for a write pole with a non-uniform write gap formed according to a method of the present invention.

In all of the aforementioned embodiments, it should be understood that by forming a non-uniform write gap, flux will travel between the write pole and trailing shield by the least reluctance path which is the track edge. Furthermore, the recessed section of the trailing edge and/or trailing shield may extend less than a neck height distance from the ABS towards the back end of the write pole. The advantage of including at least one of a center recessed trailing edge of a write pole and a center recessed trailing shield is illustrated in FIG. 6 where field gradient in Oe/nm is plotted as a function of cross-track location. At track center (0 nm), the field of a non-uniform write guard design (curve 41) is lower than that of a uniform write guard design (curve 40). However, at track edge (35-50 nm range in cross-track location) where the field defines the track for shingle writing, the field gradient is significantly higher for the non-uniform write gap design.

Figure 7:
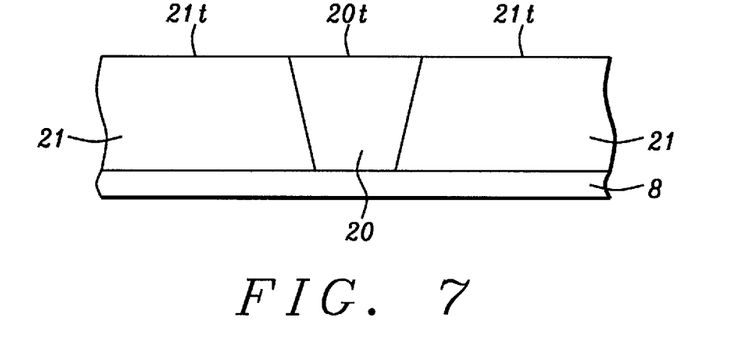
FIGS. 7-10 show a sequence of steps during the fabrication of a center recessed write pole formed according to the first embodiment of the present invention.

Referring to FIG. 7, a first step in the formation of a symmetrical write pole with a bowed trailing edge according to the first embodiment described with respect to FIG. 3 is shown. A write pole 20 having a trapezoid shape may be formed by a conventional method within a dielectric layer 21 on a substrate 8 such as AlTiC, for example. A RIE resistant layer or etch stop (not shown) such as Ru or NiCr may be formed on the substrate 8 before the dielectric layer 21 is deposited. A top surface 21t of dielectric layer 21 may be formed coplanar with the trailing edge 20t of write pole 20 by a chemical mechanical polish (CMP) process.

Figure 8:
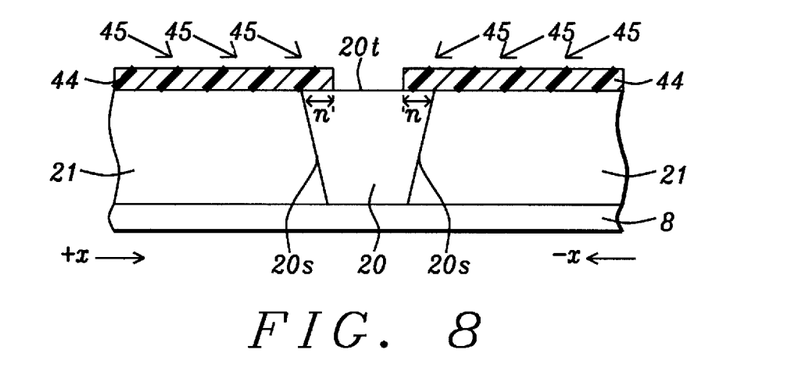

Referring to FIG. 8, photoresist layer 44 is formed on top surface 21t and over side portions of top surface 20t proximate to sides 20s. In one aspect, the photoresist layer 44 is patterned to form an opening over write pole 20 and extends a distance n beyond each side 20s and over the write pole. An IBE process is performed at a shallow angle as indicated by arrows 45 such that the ions are directed towards a center of top surface 20*t* from both directions along the x-axis. In one aspect, the wafer is rotated to achieve a sweeping motion of ion impingement on the top surface 20*t*.

Figure 9:
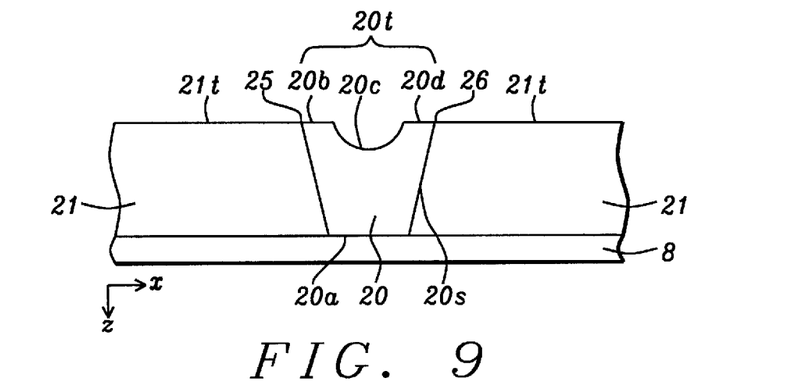

After the IBE process is completed, photoresist layer 44 is removed by a conventional method to give a trailing edge 20*t* that is bowed towards the substrate 8 and leading edge 20*a* as illustrated in FIG. 9. In particular, trailing edge 20*t* is comprised of end sections 20*b*, 20*d* that intersect with a side 20*s* at corners 25, 26, respectively, and are formed parallel to the substrate and coplanar with top surface 21*t*, and a center recessed section 20*c* with curvature. As indicated previously, recessed section 20*c* may have other shapes such as a trapezoid or rectangle formed between end sections 20*b*, 20*d*.

Figure 10:
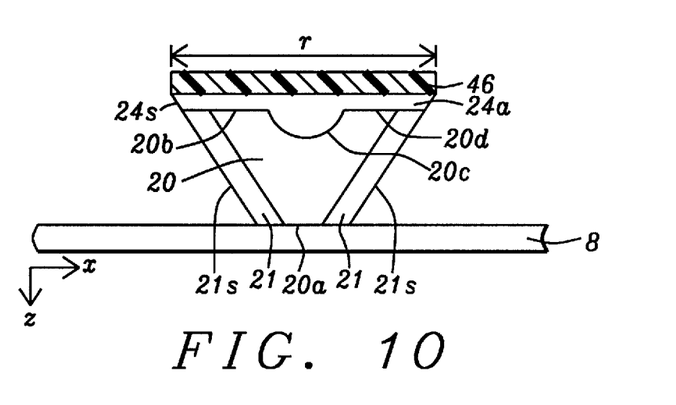

Referring to FIG. 10, a write gap layer 24*a* is deposited on trailing edge 20*t* and may be planarized by a CMP process. Then a photoresist layer 46 is coated on write gap layer 24*a* and patterned to a width r that is greater than the width of trailing edge 20*t*. One or more IBE or reactive ion etch steps are employed to etch through write gap 24*a* and side gap 21 and stop on substrate 8 or an etch stop layer (not shown). The etch through side gap 21 is preferably at an angle so that sloped sides 21*s* are formed substantially parallel to write pole sides 20*s*. Moreover, side 24*s* of write gap 24*a* is preferably coplanar with a side 21*s*.

Thereafter, photoresist 46 is removed and a magnetic material such as CoFe or CoFeNi is deposited on substrate 8 and above write gap 24*a*. The magnetic layer may be planarized by a CMP process to form a shield structure comprised of full side shields 22 and trailing shield 23 as depicted in FIG. 3.

Figure 11:
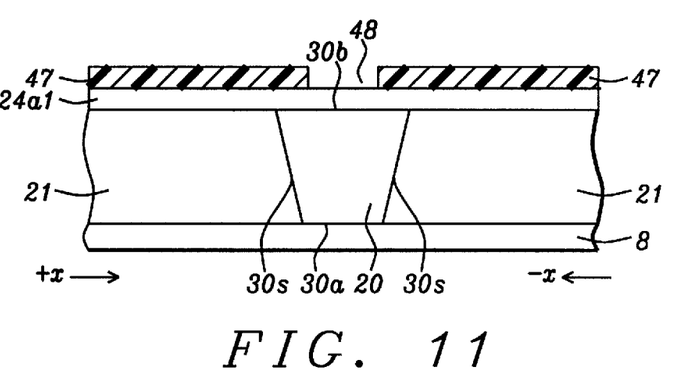
FIGS. 11-13 show a sequence of steps during the fabrication of a center recessed write gap formed according to a second embodiment of the present invention.
Figure 12:
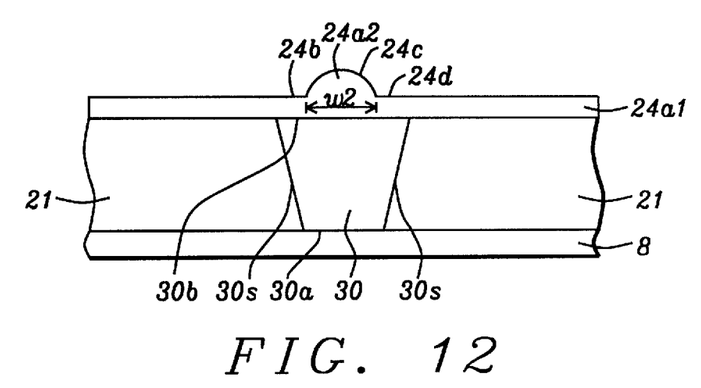
Figure 13:
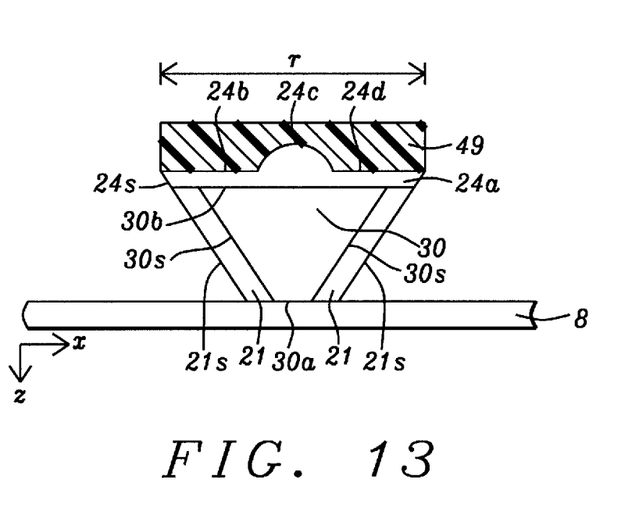

Referring to FIGS. 11-13, the present invention also encompasses a method of forming a non-uniform write gap in a PMR writer wherein the trailing shield has a recessed center section according to the second embodiment described previously. In FIG. 11, a view from the ABS is shown of a symmetrical write pole 30 having a leading edge 30*a* and a trailing edge 30*b* and formed within a dielectric layer 21. Trailing edge is formed parallel to a top surface of substrate 8 and is preferably coplanar with a top surface of dielectric layer 21. Thereafter, a dielectric layer 24*a*1 is deposited by a chemical vapor deposition (CVD) or physical vapor deposition (PVD) process, for example, and may be planarized by a chemical mechanical polish (CMP) step. In the following step, a photoresist layer 47 is coated on dielectric layer 24*a*1 and patterned by a lithography process to form an opening 48 that exposes a portion of the dielectric layer 24*a*1 above trailing edge 30*b*. Opening 48 has a width that is essentially the same as the desired width W2 of the write gap protrusion (trailing shield center recess) to be deposited in a subsequent step.

Referring to FIG. 12, dielectric layer 24*a*2 is deposited on dielectric layer 24*a*1 within opening 48 and on photoresist layer 47 by a CVD or PVD process, for example. Next, photoresist layer 47 is removed by a conventional strip process to leave a dielectric layer 24*a*2 with a substantially semi-circular, rectangular, or trapezoidal shape as a protrusion on dielectric layer 24*a*1 as mentioned previously with regard to FIG. 4. The shape of dielectric layer 24*a*2 may be modified by adjusting the angle of the sidewalls of photoresist layer in opening 48 or by adjusting the process conditions during the dielectric layer deposition process as appreciated by those skilled in the art. In the exemplary embodiment, dielectric layers 24*a*1, 24*a*2 are comprised of the same material and are hereafter referred to as write gap layer 24*a*. Dielectric layer 24*a*2 forms a center recess in a trailing shield to be deposited in a later step. In an alternative embodiment, the aforementioned dielectric layers 24*a*1, 24*a*2 may be made of different materials. The top surface of write gap layer 24*a* includes a center section 24*c* on dielectric layer 24*a*2, and end sections 24*b*, 24*d* on dielectric layer 24*a*1.

Referring to FIG. 13, a photoresist layer 49 is coated on write gap layer 24*a* and then patterned to serve as an etch mask having a width r above center section 24*c* and portions of end sections 24*b*, 24*d*. Width r is greater than the width of trailing edge 30*b*. A reactive ion etch (RIE) or ion beam etch (IBE) is performed to remove portions of end sections 24*b*, 24*d* and underlying portions of dielectric layer 21 not protected by photoresist layer 49. Furthermore, the RIE or IBE may have an angled component such that sloped sides 21*s* are formed adjacent and substantially parallel to sides 30*s* of write pole 30. After removal of photoresist layer 49, the shield structure including side shields 22 and trailing shield 23 shown in FIG. 4 is formed by depositing a magnetic material and then planarizing by a CMP step.

The advantages of the present invention are that an improved field gradient is realized at track edge in shingled writing by including one or both of a center recessed trailing edge in the main pole and a recessed trailing shield. Furthermore, track width may be modified to be significantly less than write pole width without changing pole width magnitude.

While this invention has been particularly shown and described with reference to, the preferred embodiment thereof, it will be understood by those skilled in the art that various changes in form and details may be made without departing from the spirit and scope of this invention.

I claim:

1. A PMR writer for shingle writing, comprising:
 (a) a write pole formed along an air bearing surface (ABS) with a leading edge and sections of a trailing edge formed parallel to a top surface of a substrate, and having two sides wherein each side intersects the trailing edge at a corner, said trailing edge comprises:
  (1) a first end section that terminates at a first corner and is formed parallel to the substrate;
  (2) a second end section that terminates at a second corner and is formed parallel to the substrate; and
  (3) a recessed center section connecting the first and second end sections and wherein the recessed center section is a single curved arc that is formed a lesser distance from the substrate than the first and second end sections;
 (b) a write gap formed on the trailing edge and having a non-planar top surface, comprising:
  (1) a first write gap end section formed parallel to the trailing edge and aligned above the first corner of the write pole;
  (2) a second write gap end section formed parallel to the trailing edge and aligned above the second corner of the write pole; and
  (3) a convex curve shaped center section connecting the first and second write gap end sections and wherein the convex curve shaped center section is formed a greater distance from the trailing edge than the first and second write gap end sections such that a variable first thickness of the write gap below the convex curve shaped center section is greater than a fixed second thickness below the first and second write gap end sections;
 (c) a side gap that adjoins each side of the write pole and having a side formed substantially parallel to a nearest side of the write pole and located a gap distance therefrom;

(d) a side shield that adjoins a side of each side gap and interfaces with an overlying trailing shield; and (e) the trailing shield that adjoins a top surface of each side shield and is formed on the top surface of the write gap.

2. The PMR writer of claim 1 wherein the fixed second thickness of the write gap is from 15 to 30 nm.

3. The PMR writer of claim 1 wherein each of the recessed center section of the trailing edge and the convex curve shaped center section of the write gap top surface has a width in a cross-track direction of about 20 to 200 nm.

4. The PMR writer of claim 2 wherein the variable first thickness of the write gap below the convex curve shaped center section is about 20 to 80 nm greater than the fixed second thickness.

5. The PMR writer of claim 1 wherein the first and second write gap end sections and first and second sections of the trailing edge have a width in a cross-track direction of about 20 to 80 nm.

6. The PMR writer of claim 1 wherein the center section of the write gap top surface and recessed center section of the trailing edge each have a semi-circular shape.

\* \* \* \* \*